United States Patent
Mirabel

(10) Patent No.: US 8,995,190 B2
(45) Date of Patent: Mar. 31, 2015

(54) REDUCING THE PROGRAMMING CURRENT FOR MEMORY MATRICES

(75) Inventor: Jean-Michel Mirabel, Cabries (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 246 days.

(21) Appl. No.: 13/480,145

(22) Filed: May 24, 2012

(65) Prior Publication Data

US 2012/0320681 A1    Dec. 20, 2012

(30) Foreign Application Priority Data

May 24, 2011   (FR) ...................................... 11 54499

(51) Int. Cl.
- *G11C 11/34* (2006.01)
- *G11C 16/04* (2006.01)
- *G11C 16/10* (2006.01)
- *G11C 16/34* (2006.01)

(52) U.S. Cl.
CPC ............ *G11C 16/0416* (2013.01); *G11C 16/10* (2013.01); *G11C 16/3427* (2013.01)
USPC ............. 365/185.12; 365/185.05; 365/185.27

(58) Field of Classification Search
CPC ........... G11C 16/0483; G11C 16/0433; G11C 16/0475
USPC .......................................... 365/185.27, 185.18
See application file for complete search history.

(56) References Cited

U.S. PATENT DOCUMENTS

| | | | | |
|---|---|---|---|---|
| 5,638,327 A * | 6/1997 | Dallabora et al. | ....... | 365/185.15 |
| 5,780,907 A * | 7/1998 | Ema et al. | ...................... | 257/371 |
| 5,801,994 A | 9/1998 | Chang et al. | | |
| 6,091,632 A | 7/2000 | Yoshimi et al. | | |
| 6,307,781 B1 * | 10/2001 | Shum | ........................ | 365/185.17 |
| 6,404,681 B1 * | 6/2002 | Hirano | ..................... | 365/185.33 |
| 6,921,946 B2 * | 7/2005 | Tao et al. | ....................... | 257/355 |
| 7,006,381 B2 * | 2/2006 | Dormans et al. | ......... | 365/185.28 |
| 7,151,697 B2 * | 12/2006 | Riedel et al. | ............. | 365/185.27 |
| 8,441,857 B2 * | 5/2013 | Lee | .......................... | 365/185.18 |
| 8,582,372 B2 * | 11/2013 | Kim | ......................... | 365/185.29 |
| 8,687,424 B2 * | 4/2014 | Yoon et al. | ............... | 365/185.17 |
| 2001/0013610 A1 * | 8/2001 | Chi et al. | ....................... | 257/197 |
| 2002/0020903 A1 * | 2/2002 | Kreft et al. | .................... | 257/679 |
| 2008/0266981 A1 * | 10/2008 | Koh et al. | ................ | 365/185.28 |
| 2010/0163965 A1 * | 7/2010 | Kwon | ........................... | 257/324 |
| 2011/0157982 A1 * | 6/2011 | Lee et al. | ................. | 365/185.03 |
| 2012/0261741 A1 * | 10/2012 | Lee et al. | ...................... | 257/316 |

* cited by examiner

*Primary Examiner* — J. H. Hur
*Assistant Examiner* — Ajay Ojha
(74) *Attorney, Agent, or Firm* — Allen, Dyer, Doppelt, Milbrath & Gilchrist, P.A.

(57) ABSTRACT

A sector of an electrically programmable non-volatile memory includes memory cells connected to word lines and to bit lines, each cell including at least one transistor having a gate connected to a word line, a drain connected to a bit line and a source connected to a source line. The sector includes at least two distinct wells insulated from one another, each including a number of cells of the sector, being able to take different potentials, and in that the sector has at least one bit line electrically linked to the drain of at least two cells mounted on two distinct wells.

10 Claims, 3 Drawing Sheets

REDUCING THE PROGRAMMING CURRENT FOR MEMORY MATRICES

FIELD OF THE INVENTION

The present application relates to electrically programmable memories, related devices and associated methods for fabricating and programming an electrically programmable memory sector.

BACKGROUND OF THE INVENTION

Some uses of electrically programmable memories pose strong constraints in terms of available space, such as in the case of an implementation on a microprocessor card, also called chip card. In these uses, it is routine practice to use FLASH memories, which offer the advantage of a very simple structure and compactness, making it possible to achieve a high storage capacity on a reduced surface area. However, these FLASH memories require significant currents to be applied for their programming, which induces high leakage currents and an overall high energy consumption. Now, for implementations on a contactless chip card for example, the available energy is very low since such a chip card does not generally have an built-in power source and is simply remotely powered by an external reader.

By way of illustration, FIG. 1 illustrates a sector of a conventional FLASH type electrically programmable non-volatile memory, organized in a memory plane according to a matrix of n×n cells $C_{ij}$ arranged in lines and columns, each being located at the intersection of a word line $WL_i$ and of a bit line $BL_j$. Each cell $C_{ij}$ comprises a floating gate transistor with its gate G connected to the word line $WL_i$, its drain D connected to the bit line $BL_j$ and its source S connected to a source line SL. In such a prior art structure, the term "physical memory page" is used to designate a set of the memory cells connected to one and the same word line $WL_i$. The sector of a memory is a set of pages in which the source lines LS are interconnected and are at the same electrical potential.

In such a memory, each cell Cij, represented in FIG. 2 by a floating gate transistor, can contain a binary information item, which can be modified by a programming operation to set this value to "1", which includes trapping electrical charges in the floating gate of the transistor, or by an erasure operation to set this value to "0", by extracting charges from the floating gate. As an example, the programming of such a cell of a FLASH memory according to the method known as CHISEL, an acronym standing for Channel Initiated Secondary Electron, proposes to set the potential $V_D$ of its drain D linked to a bit line to the value of 3.8 V, the potential of its source $V_S$ to 0 V, and the potential $V_B$ of its well to a negative value, for example −0.5 V, for an operating temperature of 25° C. These conditions induce a programming current in each cell of 24 nA, or a current of 12 µA circulating in a bit line for a sector comprising 512 cells on a bit line (n=512).

It should be noted that this CHISEL programming method relies on increasing the voltage between the drain and the well of each cell, which is advantageous for the effectiveness of the programming but which also induces an increased leakage current for each bit line, which amounts to 25 µA in the numerical example chosen. The result of this is a total consumed current of 37 µA on a bit line, which is significant, and, for example, exceeds the acceptable maximum for an implementation within a contactless chip card.

Thus, there is a need for an electrically programmable non-volatile memory which makes it possible to satisfy the dual constraint of a high density and a low energy consumption.

SUMMARY OF THE INVENTION

To this end, the present embodiments provide a method for electrically programming at least a part of a sector of a non-volatile memory, including generating a programming potential in a bit line linked to at least two memory cells of the same sector, the two wells of which are distinct and brought to two different potentials.

The potential of the well associated with a cell to be programmed can be brought to a negative value, whereas the potential of the well associated with another cell is brought to a value greater than or equal to zero. The sector may be of FLASH type and the current induced in a bit line for a programming operation may be less than or equal to 35 µA.

The invention also relates to a sector for electrically programmable non-volatile memory, comprising memory cells connected to word lines and to bit lines, each cell including at least one transistor comprising a gate G connected to a word line, a drain D connected to a bit line and a source S connected to a source line, and comprising a well. The sector includes at least two distinct wells insulated from one another, each comprising a number of cells of the sector, being able to take different potentials, and in that the sector comprises at least one bit line electrically linked to the drain D of at least two cells mounted on two distinct wells.

The sector may include a single source line to which all the sources S of all the cells of the sector are linked. The sector may be split up into a number of wells each of one or more pages, the bit lines being continuous and linked to a cell of each page. The sector may comprise two wells or a number of wells greater than or equal to 3. The separation forming the insulation between two wells may be less than or equal to 10 µm, or less than or equal to 5 µm, or less than or equal to 3 µm.

An electrically programmable non-volatile memory may include at least one sector as described above. This memory may be of a FLASH type. The memory may include a control device which implements the electric programming approach described above.

The present embodiments also relate to an electronic device that includes at least one electrically programmable non-volatile memory as described above. This electronic device may be a chip card with or without contact.

The present embodiments also relate to a method for fabricating a sector including fabricating the sector from at least two distinct wells, or a step for separating at least one well by buried wells.

BRIEF DESCRIPTION OF THE DRAWINGS

These objects, features and advantages of the present invention will be explained in detail in the following description of particular embodiments, given as non-limiting examples, in relation to the appended figures in which.

DETAILED DESCRIPTION OF THE PREFERRED EMBODIMENTS

Figure 1:
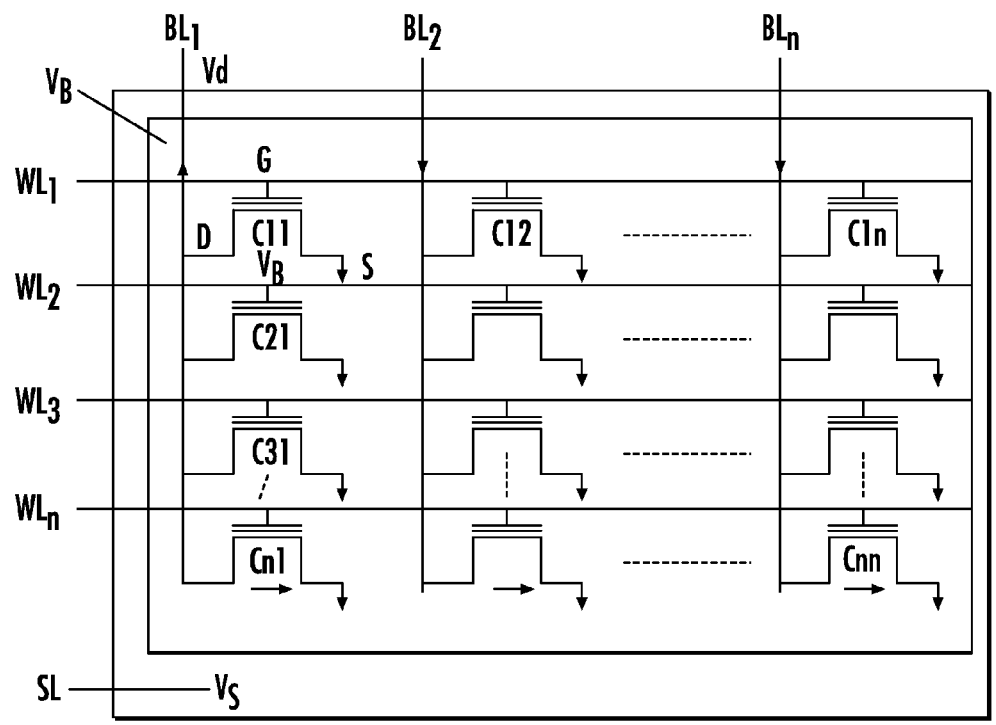
FIG. 1 is a schematic diagram illustrating the structure of a FLASH memory according to the prior art.
Figure 3:
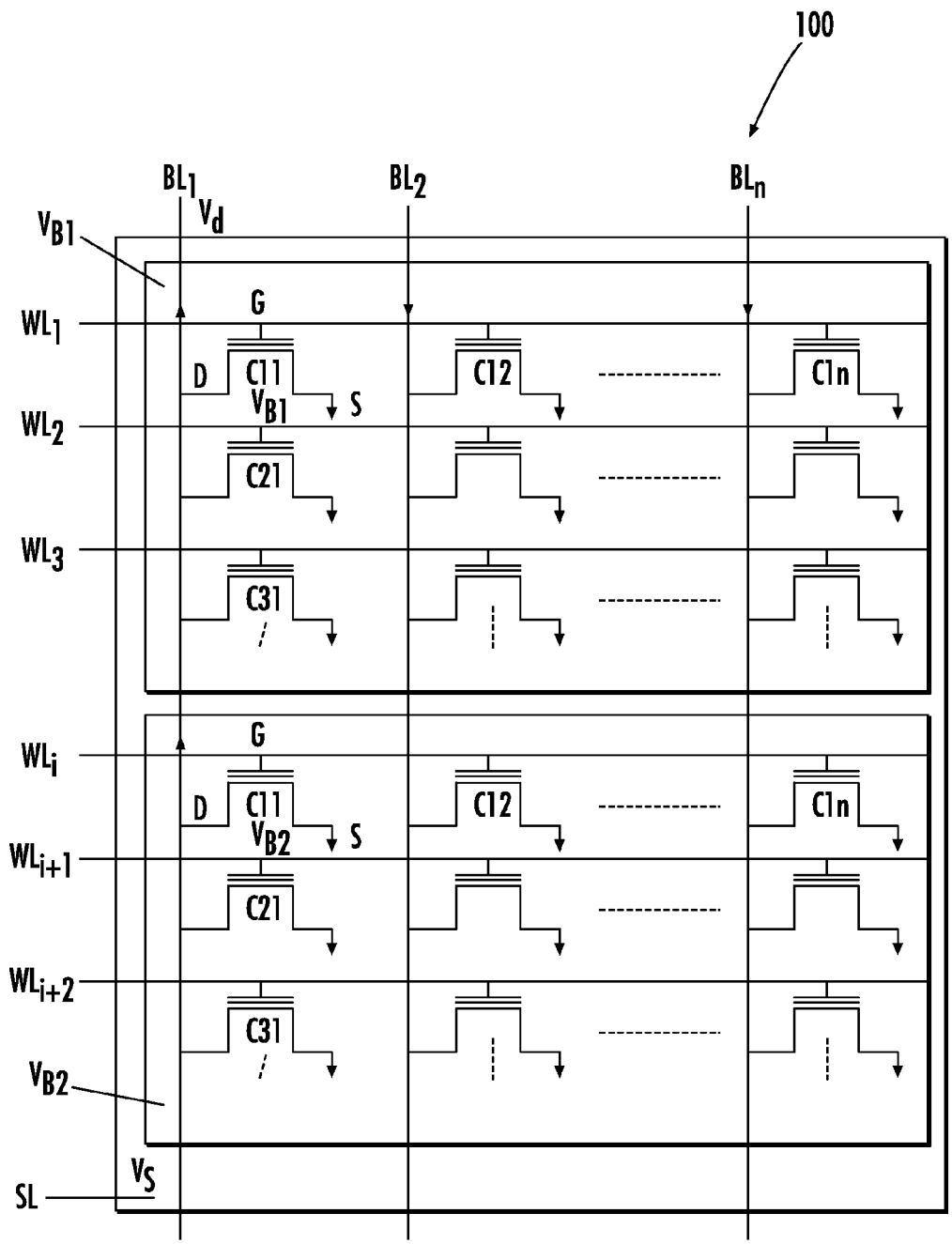
FIG. 3 is a schematic diagram illustrating the structure of a FLASH memory according to an embodiment of the present invention.

FIG. 3 schematically represents a sector 100 of a FLASH memory according to one embodiment. The sector 100 includes n×n cells Cij organized in lines and columns, each being located at the intersection of a word line WLi and of a bit line BLj. Each cell Cij comprises a floating gate transistor with its gate G connected to the word line WLi, its drain D connected to the bit line BLj. All the cells have their source S connected to the same source line SL. Unlike the sector of the prior art represented in FIG. 1, the cells of this sector 100 are associated with two distinct wells, electrically insulated, so that they can be brought to two different potentials VB1, VB2.

In this embodiment, each well comprises half the cells of the sector, for example 256×512 cells each for a sector of 512×512 cells in total. To obtain the insulation between the two wells, a small gap is sufficient, for example less than or equal to 10 µm, or even less than or equal to 5 µm, or even less than or equal to 3 µm, depending on the trade-off desired between the quality of the electrical insulation and the compactness of the memory sector. Each well thus comprises half the pages of the memory sector. Each page is arranged integrally on one of the two wells. The bit lines remain continuous and linked to the drain of all the cells of a column, therefore including 256 cells of the first and second wells.

Figure 2:
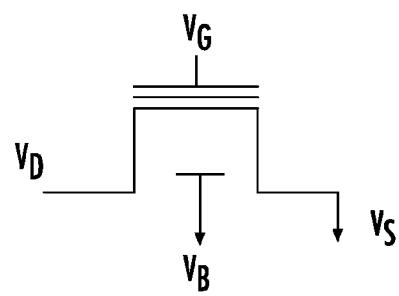
FIG. 2 is a schematic diagram illustrating a transistor of a FLASH memory according to the prior art.

The architecture described above makes it possible to implement an advantageous method for programming the memory sector. In practice, if it is the cells linked to the first well that are to be programmed, then the potential $D_{B1}$ of the first well is brought to a negative value, for example equal to −0.5 V, whereas the potential of the second well remains at a higher value, preferably greater than or equal to 0 V. Then, by acting on the bit line concerned with the cells to be programmed, the drain potential $V_D$ is brought to the programming value, for example 3.8 V using the numeric values cited in relation to the prior art. Thus, it appears that all the cells linked to the first well are positioned in the electrical configuration as explained in the example with reference to FIG. 2, which makes it possible for them to be effectively programmed, according to the CHISEL method. On the other hand, all the cells linked to the second well but linked to the same bit line which participates in the programming of the cells of the first well, are in different electrical conditions.

Figure 4:
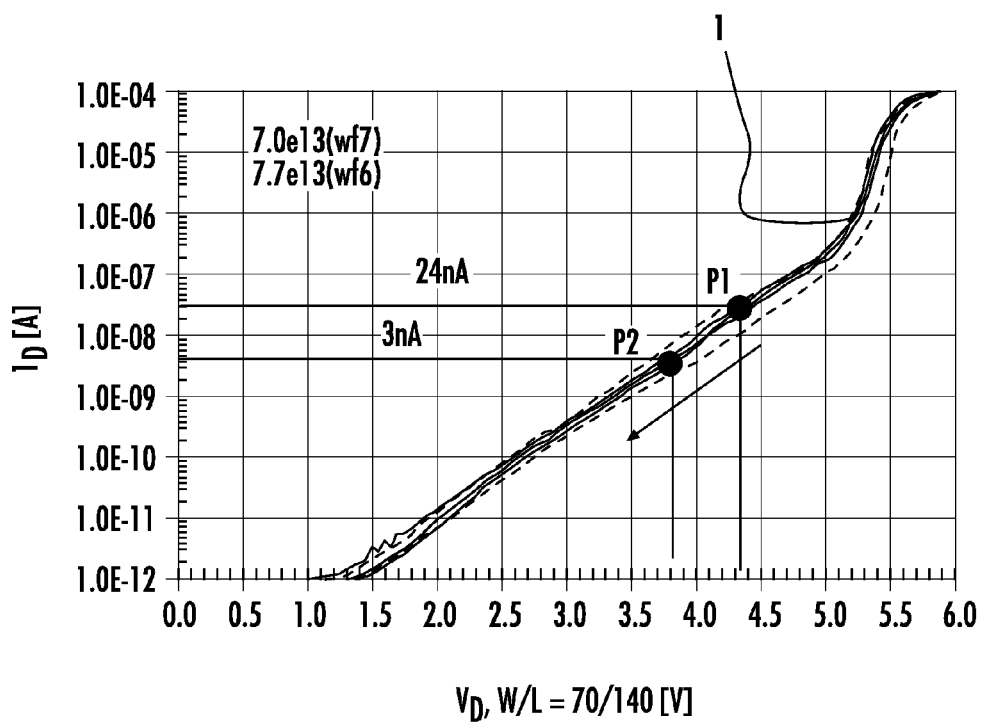
FIG. 4 is a graph illustrating the trend of the current relative to the voltage between the drain and the well in a present embodiment.

To sum up, and to illustrate the technical effect obtained by such an approach, the numeric values used previously will be used again. Each cell of the bit line concerned associated with the first well is passed through by a current of 24 nA. On the other hand, if the potential $V_{B2}$ of the second well is equal to zero, the current passing through its cells is reduced to 3 nA. Note that FIG. 4 illustrates by the curve 1 the variation of the current as a function of the voltage within a transistor. The cells of the first well are located at the point $P_1$ of this curve whereas the cells of the second well are located at the point $P_2$. It emerges therefrom that the total current consumed by the transistors of the bit line concerned amounts to: 256×24+256×3=7 µA.

By adding a leakage current again equal to 25 µA, the result is that the total current consumed by this programming operation in a bit line amounts to 32 µA, which is significantly lower than the 37 µA calculated previously with the approach of the prior art.

Of course, the numeric values mentioned above are given by way of example. The technical effect of reducing energy consumption would be obtained for any other value, provided that the two wells are set to different potentials, the well not concerned with the operation taking a value greater than the other well. Preferably, the well being programmed will take a negative potential whereas another well will have a potential greater than or equal to zero. Also, implementations other than the one represented by FIG. 3 can naturally be envisaged, for example by dividing the sector into three or more distinct wells. Each well may also comprise equal or different numbers of cells and a sector according to this architecture may comprise any other number of cells.

Finally, it is advantageous to use a number of sectors as presented hereinabove to form a complete memory. Optimally, all the sectors of a non-volatile memory will therefore be presented according to this architecture. Furthermore, such a memory also includes a control device which implements the advantageous electric programming method explained hereinabove.

Achieving a reduction in consumption while retaining a very high memory compactness, in a FLASH memory as described hereinabove, allows for a highly advantageous implementation within a chip card, and notably within a contactless chip card.

It should be noted that the architecture has been described in the context of an electrically-programmable memory of flash type but it can naturally be applied also in any other type of electrically programmable memory, particularly in any memory in which the consumption is high and to reduce it would be advantageous, notably the memories for which the programming is done by hot electrons. In all cases, it has the effect of reducing the energy consumption necessary to a programming operation.

Finally, a method for fabricating a memory sector according to the architecture described previously includes fabricating from at least two distinct wells, or a step for separating at least one well by buried wells, according to a method known as "triple well".

That which is claimed is:

1. A sector for an electrically programmable non-volatile memory, comprising:
   word lines;
   bit lines;
   at least one source line;
   an array of memory cells connected to the word lines and bit lines, each memory cell including at least one transistor having a gate connected to a word line, a drain connected to a bit line and a source connected to the at least one source line; and
   at least two distinct wells insulated from one another, each well coupled to several memory cells, and being configured to be set to different potentials, the at least two distinct wells dividing each bit line into a first partial sector and a second partial sector, memory cells in the first and second partial sectors being brought to the different potentials during a programming operation;
   wherein at least one bit line is electrically coupled to the drain of at least two memory cells coupled to the at least two distinct wells.

2. The sector according to claim 1, wherein the at least one source line comprises a single source line to which all sources of the transistors of all the memory cells of the sector are linked.

3. The sector according to claim 1, wherein the memory cells define at least two pages each associated with one of the distinct wells; and wherein the bit lines are continuous and coupled to a memory cell of each page.

4. The sector according to claim 1, wherein the at least two distinct wells comprises only two distinct wells.

5. The sector according to claim 1, wherein the at least two distinct wells are insulated from one another by a separation less than or equal to 10 µm.

6. An electronic device comprising:
an electrically programmable non-volatile memory having a sector including
word lines,
bit lines,
at least one source line,
an array of memory cells connected to the word lines and bit lines, each memory cell including at least one transistor having a gate connected to a word line, a drain connected to a bit line and a source connected to the at least one source line; and
at least two distinct wells insulated from one another, each well coupled to several memory cells, and being configured to be set to different potentials, the at least two distinct wells dividing each the bit line into a first partial sector and a second partial sector, memory cells in the first and second partial sectors being brought to the different potentials during a programming operation,
wherein at least one bit line is electrically coupled to the drain of at least two memory cells coupled to the at least two distinct wells.

7. The electronic device according to claim 6, wherein the at least one source line comprises a single source line to which all sources of the transistors of all the memory cells of the sector are linked.

8. The electronic device according to claim 6, wherein the memory cells define at least two pages each associated with one of the distinct wells; and wherein the bit lines are continuous and coupled to a memory cell of each page.

9. The electronic device according to claim 6, wherein the electrically programmable non-volatile memory defines a FLASH-type memory.

10. The electronic device according to claim 6, further comprising a control device configured to generate a programming potential in the bit line coupled to at least two memory cells of the sector coupled to two distinct wells set to different potentials.

* * * * *